United States Patent
Bilaine et al.

(10) Patent No.: US 9,580,807 B2
(45) Date of Patent: Feb. 28, 2017

(54) METHOD FOR OBTAINING A SUBSTRATE PROVIDED WITH A COATING

(75) Inventors: Matthieu Bilaine, Paris (FR); Li-Ya Yeh, Geilenkirchen (DE)

(73) Assignee: SAINT-GOBAIN GLASS FRANCE, Courbevoie (FR)

(*) Notice: Subject to any disclaimer, the term of this patent is extended or adjusted under 35 U.S.C. 154(b) by 7 days.

(21) Appl. No.: 14/003,985

(22) PCT Filed: Mar. 7, 2012

(86) PCT No.: PCT/FR2012/050476
§ 371 (c)(1),
(2), (4) Date: Dec. 5, 2013

(87) PCT Pub. No.: WO2012/120238
PCT Pub. Date: Sep. 13, 2012

(65) Prior Publication Data
US 2014/0106088 A1    Apr. 17, 2014

(30) Foreign Application Priority Data
Mar. 8, 2011 (FR) ..................... 11 51897

(51) Int. Cl.
C23C 14/58 (2006.01)
C23C 16/48 (2006.01)
(Continued)

(52) U.S. Cl.
CPC .......... *C23C 16/483* (2013.01); *B23K 26/064* (2015.10); *B23K 26/0608* (2013.01);
(Continued)

(58) Field of Classification Search
CPC ... C23C 16/483; C23C 16/56; C23C 14/5813; B23K 26/064; B23K 26/0608;
(Continued)

(56) References Cited

U.S. PATENT DOCUMENTS

2003/0080100 A1* 5/2003 Yamazaki et al. ....... 219/121.82
2004/0161913 A1   8/2004 Kawasaki et al.
(Continued)

FOREIGN PATENT DOCUMENTS

FR       2 911 130         7/2008
WO       2010 139908      12/2010
WO    WO 2010139908 A1 * 12/2010 ............. C03C 17/23

OTHER PUBLICATIONS

Steen, W.M., Mazumder, J., "Laser Material Processing", Springer 2010, Chapter 2, Basic Laser Optics, p. 114, section 2.8.2.*
(Continued)

*Primary Examiner* — Gordon R Baldwin
*Assistant Examiner* — Christina McClure
(74) *Attorney, Agent, or Firm* — Oblon, McClelland, Maier & Neustadt, L.L.P.

(57) ABSTRACT

The subject of the invention is a process for obtaining a substrate (1) provided on at least one of its sides with a coating (2), comprising a step of depositing said coating (2) then a step of heat treatment of said coating using a main laser radiation (4), said process being characterized in that at least one portion (5, 14) of the main laser radiation (4) transmitted through said substrate (1) and/or reflected by said coating (2) is redirected in the direction of said substrate in order to form at least one secondary laser radiation (6, 7, 18).

25 Claims, 3 Drawing Sheets

(51) Int. Cl.
 B23K 26/06 (2014.01)
 C03C 17/00 (2006.01)
 C03C 17/34 (2006.01)
 C03C 17/36 (2006.01)
 C23C 16/56 (2006.01)

(52) U.S. Cl.
 CPC ........ *C03C 17/002* (2013.01); *C03C 17/3417* (2013.01); *C03C 17/366* (2013.01); *C23C 14/5813* (2013.01); *C23C 16/56* (2013.01); *B23K 2201/34* (2013.01); *C03C 2218/156* (2013.01); *C03C 2218/32* (2013.01)

(58) Field of Classification Search
 CPC .............. B23K 2201/34; C03C 17/002; C03C 17/3417; C03C 17/366; C03C 2218/156; C03C 2218/32
 USPC .......................................................... 427/597
 See application file for complete search history.

(56) References Cited

U.S. PATENT DOCUMENTS

| | | | | |
|---|---|---|---|---|
| 2004/0241922 | A1* | 12/2004 | Toida | 438/166 |
| 2005/0103998 | A1* | 5/2005 | Talwar | B23K 26/0604 250/340 |
| 2005/0142708 | A1* | 6/2005 | Son et al. | 438/166 |
| 2007/0034877 | A1* | 2/2007 | Isobe et al. | 257/66 |
| 2010/0071810 | A1* | 3/2010 | Nadaud et al. | 148/400 |
| 2012/0094075 | A1* | 4/2012 | Peter et al. | 428/142 |
| 2013/0248846 | A1 | 9/2013 | Bilaine et al. | |

OTHER PUBLICATIONS

Tomsic, J.L., "Dictionary of Materials and Tsting", Society of Automotive Engineers, Inc., $2^{nd}$ Edition, 2000, p. 44.*
Bohandy, J., Kim, B.F., Adrian, F.J., Jette, A.N., "Metal Deposition at 532 nm Using a Laser Transfer Technique", 1988, Journal of Applied Physics, 63, p. 1158-1162.*
Chambers 21st Century Dictionary, "Mirror", 2001, p. 1-2.*
Daintith, J., Martin, E., "Dictionary of Science—Lens", 2010, Oxford University Press, p. 473.*
Boljanovic, V. "Applied Mathematical and Physical Formulas—Pocket Reference—16.9 Laws of Reflection", 2007, Industrial Press, p. 328-338.*
Shimadzu, "Measurement of Transmittance and Reflectance Spectra of Optical Materials (UV)", 2015, p. 1.*
HyperPhysics, "Electromagnetic Spectrum", 2007, p. 1-3.*
RP Photonics, "Encyclopedia of Laser Physics and Technology", 2008, p. 1-2.*
Bates, S.C., "Low Mass, Low Power, Low Cost Space Furnace", 2011, p. 1-13.*
International Search Report Issued Jul. 9, 2012 in PCT/FR12/50476 Filed Mar. 7, 2012.
U.S. Appl. No. 14/001,178, filed Aug. 23, 2013, Bilaine, et al.

* cited by examiner

METHOD FOR OBTAINING A SUBSTRATE PROVIDED WITH A COATING

STATEMENT REGARDING FEDERALLY SPONSORED RESEARCH OR DEVELOPMENT

Not Applicable.

CROSS REFERENCE TO RELATED APPLICATIONS

The present application is a 35 U.S.C. §371 national stage patent application of International patent application PCT/FR2012/050476, filed on Mar. 7, 2012, published as WO 2012/120238 on Sep. 13, 2012, the text of which is incorporated by reference, and claims the benefit of the filing date of Frence application no. 1151897, filed on Mar. 8, 2011, the text of which is also incorporated by reference.

THE NAMES OF THE PARTIES TO A JOINT RESEARCH AGREEMENT

Not Applicable.

INCORPORATION-BY-REFERENCE OF THE MATERIAL ON THE COMPACT DISC

Not Applicable.

BACKGROUND OF THE INVENTION

Field of the Invention

The invention relates to the heat treatment of substrates provided with coatings using a laser radiation.

Description of the related art including information disclosed under 37 CFR 1.97 and 1.98

Methods are known from applications WO 2008/096089, WO 2010/139908 or else WO 2010/142926 for the heat treatment of coatings deposited on substrates, in particular glass substrates, by laser radiation. The treated coatings comprise, for example, thin layers of silver, of titanium oxide or else of transparent electrically conductive oxides (TCOs). The laser radiation makes it possible to rapidly heat these layers and to improve their electronic conductivity or their emissivity (for the silver or TCO layers) or else their photocatalytic activity (for the titanium oxide layers). The rapid heating of the layers does not substantially heat the substrate, which is not subjected to high thermomechanical stresses, and can be immediately handled and stored, without a slow and controlled cooling step, as is the case for conventional annealing treatments.

BRIEF SUMMARY OF THE INVENTION

The objective of the invention is to improve this process in order to be able to use lasers that are less powerful and therefore less expensive for one and the same treatment speed, or to be able to treat the coatings more rapidly for one and the same laser power, or else to be able, at the same treatment speed and same laser power, to further improve the properties of the treated coatings.

For this purpose, one aspect of the invention is a process for obtaining a substrate provided on at least one of its sides with a coating, comprising a step of depositing said coating then a step of heat treatment of said coating using a main laser radiation, said process being characterized in that at least one portion of the main laser radiation transmitted through said substrate and/or reflected by said coating is redirected in the direction of said substrate in order to form at least one secondary laser radiation.

The inventors have been able to demonstrate the fact that, depending on the nature of the coatings and the wavelength of the laser radiation, most of the laser radiation was transmitted through the substrate or reflected by the coating, and therefore not used for the treatment of the coating. By recovering at least one portion of this lost radiation and by redirecting it toward the substrate, the treatment is found to be considerably improved thereby. The choice of using the portion of the main radiation transmitted through the substrate ("transmission" mode) or the portion of the main radiation reflected by the multilayer stack ("reflection" mode), or optionally of using both, depends on the nature of the layer and the wavelength of the laser radiation. Typically, the "reflection" mode will be chosen if, at the wavelength of the laser, the reflection by the multilayer stack is greater than the square of the transmission through the substrate.

DETAILED DESCRIPTION OF THE INVENTION

Figure 1:
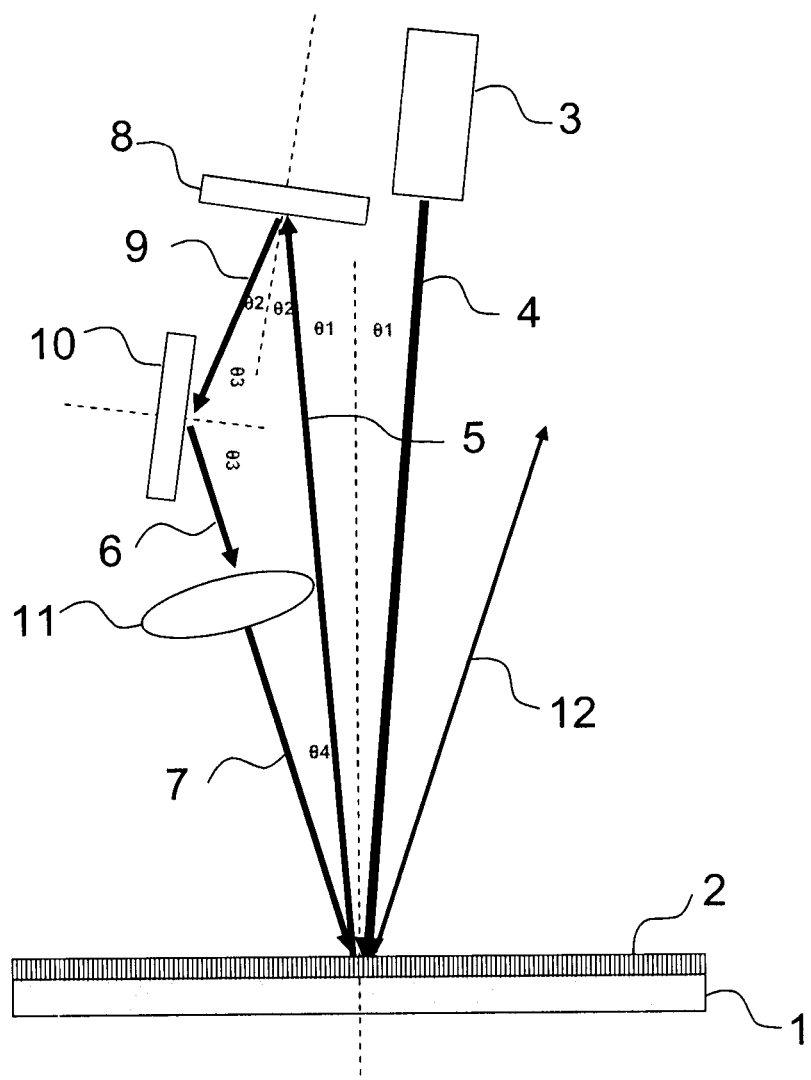
FIG. 1: An optical assembly in which the main laser radiation is reflected by the coating and redirected in the direction of said substrate with two mirrors and a lens in order to form secondary laser radiation that impacts the coating again.

According to a first embodiment ("reflection mode"), a single secondary radiation is formed, from the portion of the main laser radiation reflected by the coating. This is typically the case when the coating comprises at least one silver layer and when the wavelength of the laser is within a range extending from 500 (in particular 700) to 2000 nm.

According to a second embodiment ("transmission mode"), a single secondary radiation is formed, from the portion of the main laser radiation transmitted through the substrate.

According to a third embodiment (which combines the "reflection" and "transmission" modes), two secondary radiations are formed, one from the portion reflected by the multilayer stack, the other from the portion transmitted through the substrate.

The "reflection" mode will preferably be used for coatings that are highly reflective at the wavelength of the laser, typically the reflection of which is at least 20%.

The coating may be an individual thin layer or, most often, a multilayer stack of thin layers, at least one of which sees its properties improved by the heat treatment.

Within the context of the "reflection" mode, it is preferable for the reflection of the main radiation by the coating to be due to the layer included in the coating and the properties of which are improved by the heat treatment. This avoids deliberately having in the multilayer stack layers, the sole purpose of which is to reflect the main radiation, but the presence of which would be ultimately undesirable in the finished product. On the contrary, it is preferred to take advantage of the "natural" reflection of the layer to be treated. By way of example, when the multilayer stack contains a reflective layer (typically a silver layer), the crystallization properties of which it is desired to improve, it is preferable to redirect to the multilayer stack the portion of the main radiation reflected by the reflected layer itself, rather than by layers positioned underneath this reflective layer.

The substrate is preferably made of glass or of a polymeric organic material. It is preferably transparent, colorless (it is then a clear or extra-clear glass) or colored, for example blue, grey, green or bronze. The glass is preferably of soda-lime-silica type, but it may also be glass of borosilicate or alumino-borosilicate type. The preferred polymeric organic materials are polycarbonate, polymethyl methacrylate, polyethylene terephthalate (PET), polyethylene naphthalate (PEN), or else fluoropolymers such as ethylene tetrafluoroethylene (ETFE). The substrate advantageously has at least one dimension greater than or equal to 1 m, or 2 m and even 3 m. The thickness of the substrate generally varies between 0.5 mm and 19 mm, preferably between 0.7 and 9 mm, in particular between 2 and 8 mm, or between 4 and 6 mm. The substrate may be flat or curved, or even flexible.

The glass substrate is preferably of float glass type, that is to say capable of having been obtained by a process that consists in pouring the molten glass onto a bath of molten tin ("float" bath). In this case, the layer to be treated may equally be deposited on the "tin" side as on the "atmosphere" side of the substrate. The terms "atmosphere" and "tin" sides are understood to mean the sides of the substrate that have respectively been in contact with the atmosphere in the float bath and in contact with the molten tin. The tin side contains a small superficial amount of tin that has diffused into the structure of the glass. The glass substrate may also be obtained by rolling between two rolls, a technique that makes it possible in particular to imprint patterns onto the surface of the glass.

The treated coating preferably comprises a thin layer chosen from silver layers, titanium oxide layers and transparent electrically conductive layers. The coating is advantageously a low emissivity coating, in particular the emissivity of which is at most 20% or 10%, for example comprising at least one silver layer. These coatings generally have high reflections at laser wavelengths between 700 and 2000 nm so that the effectiveness of the treatment is greatly improved owing to the invention.

Preferably, the heat treatment step does not use melting, even partial melting, of the layers present in the multilayer stack. The heat treatment then makes it possible to provide sufficient energy to promote the crystallization of the thin layer by a physicochemical mechanism of crystalline growth around nuclei already present in the layer, while remaining in the solid phase. This treatment does not use a mechanism of crystallization by cooling starting from a molten material, on the one hand because that would require extremely high temperatures and, on the other hand, because that would be capable of modifying the thicknesses or the refractive indices of the layers, and therefore their properties, by modifying, for example, their optical appearance. The transparent electrically conductive layers are typically based on mixed indium tin oxides (referred to as "ITOs"), based on mixed indium zinc oxides (referred to as "IZOs"), based on gallium-doped or aluminum-doped zinc oxide, based on niobium-doped titanium oxide, based on cadmium or zinc stanate, or based on tin oxide doped with fluorine and/or with antimony. These various layers have the distinctive feature of being layers that are transparent and nevertheless conductive or semiconductive, and are used in many systems where these two properties are necessary: liquid crystal displays (LCDs), solar or photovoltaic collectors, electrochromic or electroluminescent devices (in particular LEDs, OLEDs), etc. Their thickness, generally driven by the desired sheet resistance, is typically between 50 and 1000 nm, limits included.

For the ITO layers, use will preferably be made of the "transmission" mode (by reusing the portion of the main radiation transmitted through the substrate), with a wavelength within a range extending from 400 to 1200 nm, in particular from 800 to 1000 nm. In the case of layers of zinc or tin oxide, use will advantageously be made of the "transmission" mode, with a wavelength within a range extending from 400 nm to 12 micrometers, in particular from 1 to 12 micrometers.

Thin layers based on metallic silver, but also based on metallic molybdenum or metallic niobium, have electrical conduction and infrared radiation reflection properties, hence their use in solar-controlled glazing, in particular solar-protection glazing (with the aim of reducing the amount of incoming solar energy) or low-emissivity glazing (with the aim of reducing the amount of energy dissipated to the outside of a building or a vehicle). Their physical thickness is typically between 4 and 20 nm (limits included). The low-emissivity multilayer stacks may frequently comprise several silver layers, typically two or three. The or each silver layer is generally surrounded by dielectric layers that protect it from corrosion and make it possible to adjust the appearance of the coating in reflection. For the silver layers having a thickness of at least 11 nm, use will preferably be made of the "reflection" mode, with a wavelength ranging from 400 (in particular 700) to 2000 nm, or even from 800 to 1200 nm (in particular 1000 nm). In the case of silver layers having a thickness of less than 11 nm and in the case of niobium layers, use will preferably be made of the "transmission" mode, with a wavelength ranging from 400 (in particular 700) to 2000 nm, or even from 800 to 1200 nm (in particular 1000 nm).

The thin layers based on titanium oxide have the distinctive feature of being self-cleaning, by facilitating the degradation of organic compounds under the action of ultraviolet radiation and the removal of mineral soiling (dust) under the action of water runoff. Their physical thickness is preferably between 2 and 50 nm, in particular between 5 and 20 nm, limits included. For layers of this type, use will preferably be made of the "transmission" mode, with a wavelength within a range extending from 400 nm to 12 micrometers, in particular from 500 to 1000 nm.

The various layers mentioned have the common distinctive feature of seeing their properties improved when they are in an at least partially crystallized state. It is generally sought to maximize the degree of crystallization of these layers (the proportion of crystallized material by weight or by volume) and the size of the crystalline grains (or the size of the coherent diffraction domains measured by X-ray diffraction methods), or even in certain cases to favor a particular crystallographic form.

In the case of titanium oxide, it is known that titanium oxide crystallized in anatase form is much more effective in terms of degradation of organic compounds than amorphous titanium oxide or titanium oxide crystallized in rutile or brookite form.

It is also known that the silver layers having a high degree of crystallization and consequently a low residual content of amorphous silver have a lower emissivity and a lower resistivity than predominantly amorphous silver layers. The electrical conductivity and the low-emissivity properties of these layers are thus improved.

Similarly, the aforementioned transparent conductive layers, especially those based on doped zinc oxide or the tin-doped indium oxide layers have an even higher electrical conductivity when their degree of crystallization is high.

Preferably, when the coating is conductive, its sheet resistance is reduced by at least 10%, or 15% or even 20% by the heat treatment. Here this is a question of a relative reduction, with respect to the value of the sheet resistance before treatment.

The use of laser radiation has the advantage of obtaining temperatures generally of less than 100° C., but even often less than 50° C. at the side opposite the first side of the substrate (that is to say at the uncoated side). This particularly advantageous feature is due to the fact that the heat exchange coefficient is very high, typically greater than 400 W/(m$^2$.s). The surface power density of the laser radiation at the multilayer stack to be treated is preferably greater than or equal to 20 or 30 kW/cm$^2$. This very high energy density makes it possible to achieve, at the coating, the desired temperature extremely rapidly (in general in a time of less than or equal to 1 second) and consequently to limit the treatment time accordingly, the heat generated then not having the time to diffuse within the substrate. Thus, each point of the coating is preferably subjected to the treatment according to the invention (and in particular brought to a temperature greater than or equal to 300° C.) for a time generally of less than or equal to 1 second, or even 0.5 second. Conversely, since the infrared lamps conventionally used (without a radiation focusing device) do not make it possible to achieve these high powers per unit surface area, the treatment time must be longer to achieve the desired temperatures (often several seconds), and the substrate is then inevitably brought to high temperatures by diffusion of the heat, even if the wavelength of the radiation is adapted so as to only be absorbed by the coating and not by the substrate.

Owing to the very high heat exchange coefficient associated with the process according to the invention, the portion of the glass located at 0.5 mm from the coating is not generally subjected to temperatures of greater than 100° C. The temperature of the side of the substrate opposite the side treated by the at least one laser radiation preferably does not exceed 100° C., in particular 50° C. and even 30° C. during the heat treatment.

For greater implementation simplicity, the lasers employed in the context of the invention may be fiberized, which means that the laser radiation is injected into an optical fiber and then delivered close to the surface to be treated via a focusing head. The laser may also be a fiber laser, in the sense that the amplifying medium is itself an optical fiber.

The laser beam may be a point laser beam, in which case it is necessary to provide a system for moving the laser beam in the plane of the substrate.

Preferably however, the main laser radiation is emitted by at least one laser beam forming a line, called a "laser line" in the rest of the text, which simultaneously irradiates all or part of the width of the substrate. This embodiment is preferred as it avoids the use of expensive moving systems, which are generally bulky and difficult to maintain. The in-line laser beam may especially be obtained using systems of high-power laser diodes combined with focusing optics. The thickness of the line is preferably between 0.01 and 1 mm. The length of the line is typically between 5 mm and 1 m. The profile of the line may especially be a Gaussian curve or have a square-wave configuration.

The laser line simultaneously irradiating all or part of the width of the substrate may be made up of a single line (in which case it irradiates the entire width of the substrate) or a plurality of optionally separate lines. When a plurality of lines is used, it is preferable for each line to be placed so that the entire area of the multilayer stack is treated. The or each line is preferably placed so as to be perpendicular to the run direction of the substrate or placed obliquely. The various lines may treat the substrate simultaneously or in a delayed manner. The important point is that the entire surface is treated.

To treat the entire surface of the layer, it is preferable to employ a relative movement between, on the one hand, the substrate and, on the other hand, the or each laser line. The substrate may thus be moved, especially so as to run translationally past the stationary laser line, generally beneath it, but optionally above said laser line. This embodiment is particularly advantageous for a continuous treatment. Alternatively, the substrate may be stationary and the laser may be moved. Preferably, the difference between the respective speeds of the substrate and the laser is greater than or equal to 1 meter per minute, or 4 meters per minute or even 6, 8, 10 or 15 meters per minute, so as to ensure a high treatment rate.

When it is the substrate that is moving, especially translationally, it may be moved using any mechanical conveying means, for example belts, rollers or trays running translationally. The conveying system is used to control and regulate the run speed. If the substrate is made of a flexible polymeric organic material, it may be moved using a film advance system in the form of a succession of rollers.

The laser may also be moved so as to adjust its distance from the substrate, which may in particular be useful when the substrate is bent, but not only in such a case. Indeed, it is preferable for the laser beam to be focused onto the coating to be treated so that the latter is located at a distance of less than or equal to 1 mm from the focal plane. If the system for moving the substrate or moving the laser is not sufficiently precise as regards the distance between the substrate and the focal plane, it is preferable to be able to adjust the distance between the laser and the substrate. This adjustment may be automatic, especially regulated using a distance measurement upstream of the treatment.

When the laser line is moving, it is necessary to provide a system for moving the laser, located above or beneath the substrate. The duration of the treatment is regulated by the run speed of the laser line.

Of course, all relative positions of the substrate and the laser are possible provided that the surface of the substrate can be suitably irradiated. More generally, the substrate is placed horizontally, but it may also be placed vertically, or at any possible inclination. When the substrate is placed horizontally, the laser is generally placed so as to irradiate the top side of the substrate. The laser may also irradiate the underside of the substrate. In this case, it is necessary for the substrate support system, and optionally the substrate conveying system when the substrate is moving, to let the radiation into the zone to be irradiated. This is the case for example when conveying rollers are used. Since the rollers are separate entities, it is possible to place the laser in a zone located between two successive rollers.

When both sides of the substrate are to be treated, it is possible to employ a number of lasers located on either side of the substrate, whether the latter is in a horizontal, vertical or any inclined position. These lasers may be identical or different, in particular their wavelengths may be different, especially adapted to each of the coatings to be treated. By way of example, a first coating (for example low-emissivity coating) located on a first side of the substrate may be treated by a first laser radiation that emits, for example, in the visible or the near infrared, whilst a second coating (for example a photocatalytic coating) located on the second side of said substrate may be treated by a second laser radiation, that emits for example in the far infrared.

The radiation device, for example the in-line laser, may be integrated into a layer deposition line, for example a magnetron sputtering deposition line or a chemical vapor deposition (CVD) line, especially a plasma-enhanced (PECVD) line, under vacuum or at atmospheric pressure (AP-PECVD). In general, the line includes substrate handling devices, a deposition unit, optical control devices and stacking devices. For example, the substrates run on conveyor rollers, in succession past each device or each unit.

The radiation device, for example the in-line laser, is preferably located just after the coating deposition unit, for example at the exit of the deposition unit. The coated substrate may thus be treated in line after the coating has been deposited, at the exit of the deposition unit and before the optical control devices, or after the optical control devices and before the substrate stacking devices.

The radiation device may also be integrated into the deposition unit. For example, the laser may be introduced into one of the chambers of a sputtering deposition unit, especially in a chamber in which the atmosphere is rarefied, especially at a pressure between $10^{-6}$ mbar and $10^{-2}$ mbar. The laser may also be placed outside the deposition unit, but so as to treat a substrate located inside said unit. For this purpose, all that is required is to provide a window transparent to the wavelength of the radiation used, through which the laser beam passes to treat the layer. It is thus possible to treat a layer (for example a silver layer) before the subsequent deposition of another layer in the same unit.

Whether the radiation device is outside the deposition unit or integrated thereinto, these "in-line" processes are preferable to a process involving off-line operations, in which it would be necessary to stack the glass substrates between the deposition step and the heat treatment.

However, processes involving off-line operations may have an advantage in cases in which the heat treatment according to the invention is carried out in a place different from that where the deposition is carried out, for example in a place where conversion of the glass takes place. The radiation device may therefore be integrated into lines other than the layer deposition line. For example, it may be integrated into a multiple glazing (especially double or triple glazing) manufacturing line or into a laminated glazing manufacturing line. In these various cases, the heat treatment according to the invention is preferably carried out before the multiple glazing or laminated glazing is produced.

The multilayer stack may be deposited on the substrate by any type of process, in particular processes generating predominantly amorphous or nanocrystalline layers, such as the sputtering, especially magnetron sputtering, process, the plasma-enhanced chemical vapor deposition (PECVD) process, the vacuum evaporation process or the sol-gel process.

Preferably, the multilayer stack is deposited by sputtering, especially magnetron sputtering.

For greater simplicity, the laser treatment of the layer preferably takes place in air and/or at atmospheric pressure. However, it is possible for the heat treatment of the layer to be carried out within the actual vacuum deposition chamber, for example before a subsequent deposition.

The wavelength of the laser radiation is preferably between 500 and 2000 nm, in particular between 700 and 1100 nm. This range of wavelengths is particularly well suited to the case of silver layers. The absorption of the coating at the wavelength of the laser, usually defined as being the balance to 100% of the reflection and of the transmission, is advantageously at least 20%, in particular 30%. On the contrary, the glass (especially clear or extra-clear glass) and most plastics only absorb a small amount in this wavelength range so that the substrate is only slightly heated by the radiation. Use is preferably made of laser diodes, that emit for example at a wavelength of the order of 808 nm, 880 nm, 915 nm or else 940 nm or 980 nm. In the form of systems of diodes, very high power levels can be obtained, that may reach surface power densities on the multilayer stack to be treated of greater than 20 kW/cm$^2$, or even 30 kW/cm$^2$.

The secondary laser radiation is preferably formed by reflecting the portion of the main laser radiation transmitted through the substrate and/or reflected by the at least one coating with the aid of at least one mirror or at least one prism, and optionally at least one lens.

Preferably, the formation of the or each secondary laser radiation uses an optical assembly that comprises only optical elements chosen from mirrors, prisms and lenses, preferably an assembly consisting of two mirrors and one lens, or of one prism and one lens. In this way, the optical assembly is completely independent of the wavelength of the laser, unlike the case where the assembly comprises elements such as beam splitters or retarders (quarter-wave plates, half-wave plates, etc.). It is thus possible to use one and the same optical assembly for various layers.

The secondary laser radiation is preferably not polarized. The optical assembly used to form and redirect secondary laser radiation is thus considerably simplified, by avoiding elements such as beam splitters or retarders (quarter-wave plates, half-wave plates, etc.), which may only operate for a very specific wavelength, and lead to power losses.

The angle formed by the main radiation (and/or the secondary radiation) and the normal to the substrate is preferably non-zero, typically less than 45°, in particular between 8° and 13°, in order to prevent any damage of the laser by the reflection of the main or secondary radiation. For the same reasons, it is preferable for the angle formed by the main radiation and the normal to the substrate to be different from the angle formed by the secondary radiation (in "transmission" mode) or by the reflected portion of the secondary radiation (in "reflection" mode) and the normal to the substrate.

In order to improve the effectiveness of the treatment, the secondary laser radiation preferably has the same profile as the main laser radiation.

In order to increase the effectiveness of the treatment, it is preferable for the secondary laser radiation to impact the substrate at the same location as the main laser radiation. The expression "same location" is understood to mean that the two radiations are at a distance of at most 0.1 mm, or even 0.05 mm (distance measured over the treated surface). In order to optimize the effectiveness of the treatment, the depth of focus of the secondary laser radiation is advantageously the same as that of the main laser radiation.

Figure 2:
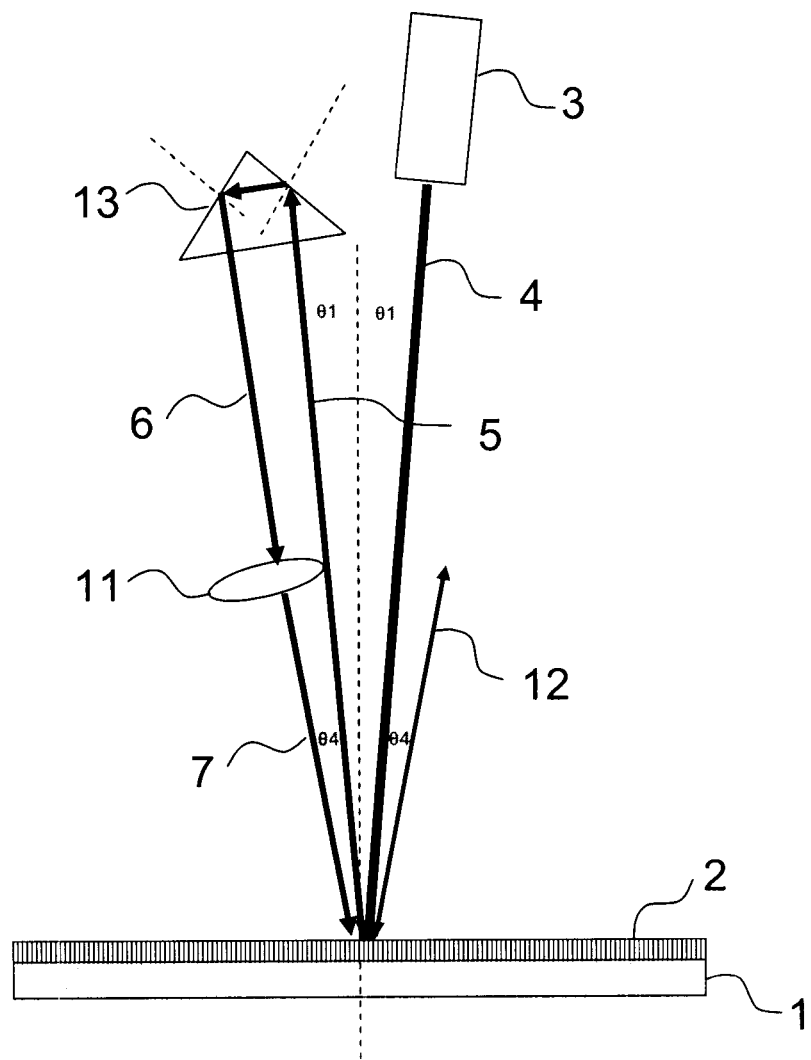
FIG. 2: An optical assembly in which the main laser radiation is reflected by the coating and redirected in the direction of said substrate with a prism and a lens in order to form secondary laser radiation that impacts the coating again.
Figure 3:
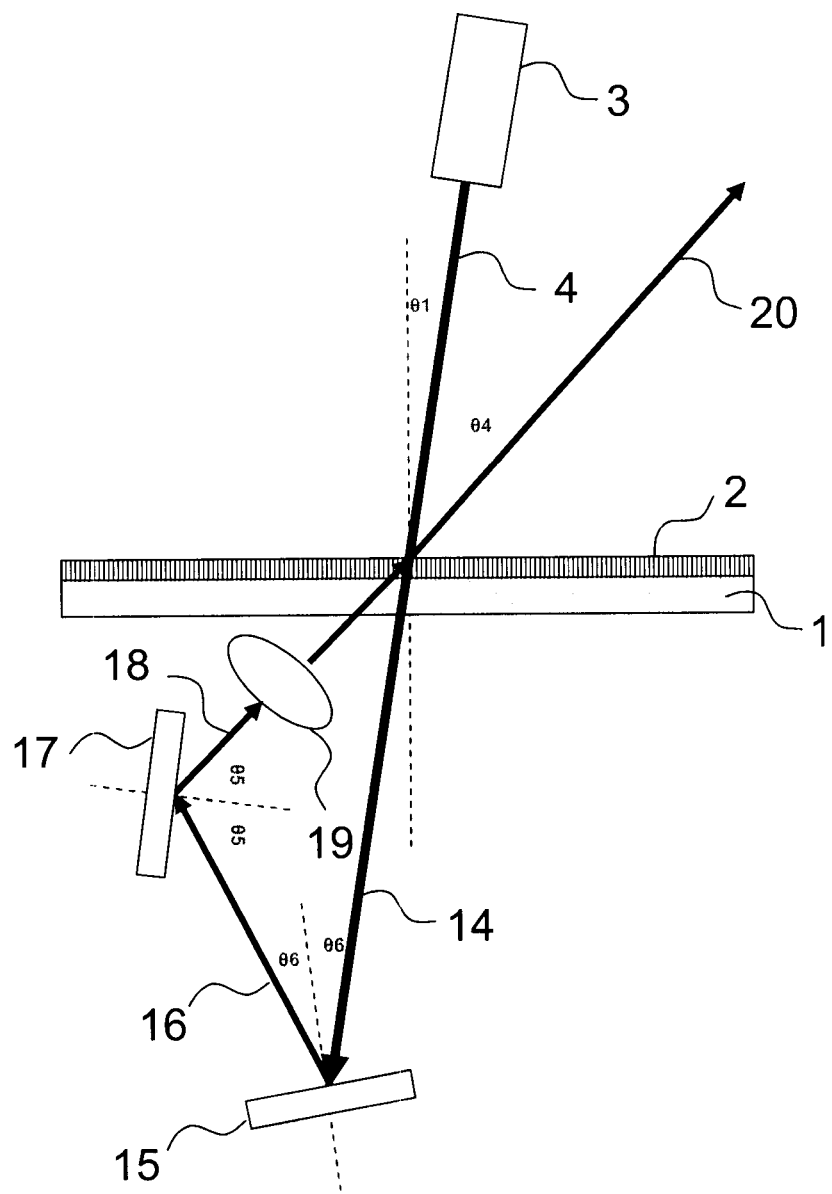
FIG. 3: An optical assembly in which the main laser radiation is transmitted through the substrate and redirected in the direction of said substrate with two mirrors and a lens in order to form secondary laser radiation that impacts the coating again.

Various optical assemblies that make it possible to implement the process according to the invention are illustrated by FIGS. 1 to 3.

In a first assembly (not represented), a portion of the main radiation is reflected by the coating, and a single mirror is positioned so as to reflect this radiation toward the substrate. Preferably, the main radiation and the secondary radiation impact the coating at the same location. This very simple assembly comprises only one mirror. The angle formed by the main radiation and the normal to the substrate is preferably non-zero, so as to prevent any damage of the laser by the reflection of the main radiation. This angle is preferably less than 45°, typically between 2° and 20°, in particular between 8° and 13°. This assembly is advantageously used for highly reflective multilayer stacks, such as the multilayer stacks containing at least one silver layer.

A second assembly, of use also, but not only, for highly reflective coatings, is illustrated in FIG. 1. It consists in placing a first mirror 8 that reflects the reflected main radiation toward a second mirror 10, which forms, by reflection, the secondary radiation 6, 7. A lens optionally makes it possible to adjust the secondary radiation 7 and to focus it at the precise location where the main radiation 4 impacts the coating (again with a tolerance of at most 0.1 mm, or even 0.05 mm).

More specifically, a laser 3 emits a main radiation 4 (typically an in-line laser) toward the substrate 1 coated with its multilayer stack 2, the radiation 4 forming, with the normal to the substrate 1, an angle $\theta_1$.

A portion of this main radiation 4 is reflected by the multilayer stack 2, in the form of a radiation 5, which also forms, with the normal to the substrate, the same angle $\theta_1$. The angle $\theta_1$ is non-zero, in particular between 5° and 15°, or even between 8° and 13°, so as to prevent the radiation 5 from damaging the laser 3. The reflective portion 5 is then, in turn, reflected by a first mirror 8 then by a second mirror 10, so as to form a secondary radiation 6, 7, which is focused using a lens 11 toward the coating 2. The radiations 5 and 9 form, with the normal to the first mirror 8, a non-zero angle $\theta_2$, typically between 5° and 15°, in particular between 8° and 13°.

This assembly is slightly more complex than the first assembly, but is advantageous in that the portion 12 of the secondary radiation reflected by the coating 2 cannot damage the laser 3 due to the fact that the angle $\theta_4$ between the secondary radiation 7 and the normal to the substrate 2 is greater than the angle $\theta_1$. The angle $\theta_4$ is preferably between 10° and 20°, in particular between 13° and 18°. By a simple adjustment of the orientation of the mirrors 8 and 10, and therefore of the angles $\theta_2$ and $\theta_3$, the secondary radiation 7 can impact the coating 2 exactly at the same location as the main radiation 4.

According to one variant of this second assembly, illustrated by FIG. 2, the first and second mirrors are replaced by a prism 13, which has the advantage of a greater ease of adjustment.

FIG. 3 illustrates a third assembly, using the "transmission" mode of the process according to the invention, useful for the treatment of coatings that are not very reflective. In this embodiment, the portion 14 of the main radiation 4 transmitted through the substrate 1 is reflected by a first mirror 15, then by a second mirror 17, in order to form a secondary radiation 18, which after focusing with the aid of a lens 19 will impact the coating 2 at the same location as the main radiation 4 (radiation 20). The use of two mirrors makes it possible to choose non-zero angles $\theta_5$ and $\theta_6$ (between the radiation 16 and the normals to the mirrors, respectively 15 and 17), which results in an angle $\theta_4$ between the transmitted portion of the secondary radiation 18 and the normal to the substrate 1 which is different from the angle $\theta_1$. Such an assembly once again makes it possible to avoid damaging the laser 3 by direct reflection of the transmitted radiation 14.

According to one variant that is not represented, the substrate 1 may be provided on the side opposite that bearing the coating 2, with an identical or different coating 2', which may also be treated at the same time as the coating 2.

In order to further improve the final properties of the coating, the substrate may undergo a tempering step after the heat treatment step according to the invention. The thermal tempering will generally be carried out after cutting the glass to the desired final dimensions.

When the coating to be treated is a low-emissivity multilayer stack, it preferably comprises, starting from the substrate, a first coating comprising at least a first dielectric layer, at least a silver layer, optionally an overblocker layer and a second coating comprising at least a second dielectric layer.

Preferably, the physical thickness of the or each silver layer is between 6 and 20 nm.

The overblocker layer is intended to protect the silver layer during the deposition of a subsequent layer (for example if the latter is deposited in an oxidizing or nitriding atmosphere) and during an optional heat treatment of tempering or bending type.

The silver layer may also be deposited on and in contact with an underblocker layer. The multilayer stack can therefore comprise an overblocker layer and/or an underblocker layer flanking the or each silver layer.

Blocker (underblocker and/or overblocker) layers are generally based on a metal chosen from nickel, chromium, titanium, niobium or an alloy of these various metals. Mention may in particular be made of nickel-titanium alloys (especially those containing about 50% of each metal by weight) and nickel-chromium alloys (especially those containing 80% nickel by weight and 20% chromium by weight). The overblocker layer may also consist of several superposed layers; for example, on moving away from the substrate, a titanium layer and then a nickel alloy (especially a nickel-chromium alloy) layer, or vice versa. The various metals or alloys cited may also be partially oxidized, and may especially be oxygen substoichiometric (for example $TiO_x$ or $NiCrO_x$).

These blocker (underblocker and/or overblocker) layers are very thin, normally having a thickness of less than 1 nm, so as not to affect the light transmission of the multilayer stack, and can be partially oxidized during the heat treatment according to the invention. In general, the blocker layers are sacrificial layers capable of capturing oxygen coming from the atmosphere or from the substrate, thus preventing the silver layer from oxidizing.

The first and/or the second dielectric layer is typically an oxide (especially tin oxide), or preferably a nitride, especially silicon nitride (in particular in the case of the second dielectric layer, the one further away from the substrate). In general, the silicon nitride may be doped, for example with aluminum or boron, so as to make it easier to deposit it by sputtering techniques. The degree of doping (corresponding to the atomic percentage relative to the amount of silicon) generally does not exceed 2%. The function of these dielectric layers is to protect the silver layer from chemical or mechanical attack and they also influence the optical properties, especially in reflection, of the multilayer stack, through interference phenomena.

The first coating may comprise one dielectric layer or a plurality, typically 2 to 4, of dielectric layers. The second coating may comprise one dielectric layer or a plurality, typically 2 to 3, of dielectric layers. These dielectric layers are preferably made of a material chosen from silicon nitride, titanium oxide, tin oxide and zinc oxide, or any of their mixtures or solid solutions, for example a tin zinc oxide, or a titanium zinc oxide. The physical thickness of the dielectric layer, or the overall physical thickness of all the dielectric layers, whether in the first coating or in the second coating, is preferably between 15 and 60 nm, especially between 20 and 50 nm.

The first coating preferably comprises, immediately beneath the silver layer or beneath the optional underblocker layer, a wetting layer, the function of which is to increase the wetting and bonding of the silver layer. Zinc oxide, especially when doped with aluminum, proves to be particularly advantageous in this regard.

The first coating may also contain, directly beneath the wetting layer, a smoothing layer, which is a partially or completely amorphous mixed oxide (and therefore one having a very low roughness), the function of which is to promote growth of the wetting layer in a preferential crystallographic orientation, thereby promoting silver crystallization through epitaxial phenomena. The smoothing layer is preferably composed of a mixed oxide of at least two metals chosen from Sn, Zn, In, Ga and Sb. A preferred oxide is antimony-doped indium tin oxide.

In the first coating, the wetting layer or the optional smoothing layer is preferably deposited directly on the first dielectric layer. The first dielectric layer is preferably deposited directly on the substrate. For optimally adapting the optical properties (especially the appearance in reflection) of the multilayer stack, the first dielectric layer may as an alternative be deposited on another oxide or nitride layer, for example a titanium oxide layer.

Within the second coating, the second dielectric layer may be deposited directly on the silver layer or preferably on an overblocker, or else on other oxide or nitride layers intended for adapting the optical properties of the multilayer stack. For example, a zinc oxide layer, especially one doped with aluminum, or a tin oxide layer, may be placed between an overblocker and the second dielectric layer, which is preferably made of silicon nitride. Zinc oxide, especially aluminum-doped zinc oxide, helps to improve the adhesion between the silver and the upper layers.

Thus, the multilayer stack treated according to the invention preferably comprises at least one ZnO/Ag/ZnO succession. The zinc oxide may be doped with aluminum. An underblocker layer may be placed between the silver layer and the subjacent layer. Alternatively or additionally, an overblocker layer may be placed between the silver layer and the superjacent layer.

Finally, the second coating may be surmounted by an overlayer, sometimes referred to as an overcoat in the art. This last layer of the multilayer stack, which is therefore the one in contact with the ambient air, is intended to protect the multilayer stack from any mechanical attack (scratches, etc.) or chemical attack. This overcoat is generally very thin so as not to disturb the appearance in reflection of the multilayer stack (its thickness is typically between 1 and 5 nm). It is preferably based on titanium oxide or a mixed tin zinc oxide, especially one doped with antimony, deposited in substoichiometric form.

The multilayer stack may comprise one or more silver layers, especially two or three silver layers. Where more than one silver layer is present, the general architecture presented above may be repeated. In this case, the second coating relating to a given silver layer (and therefore located above this silver layer) generally coincides with the first coating relating to the next silver layer.

The coated substrates obtained according to the invention may be used in single, multiple or laminated glazing, mirrors, and glass wall coverings. If the coating is a low-emissivity multilayer stack, and in the case of multiple glazing comprising at least two glass sheets separated by a gas-filled cavity, it is preferable for the multilayer stack to be placed on the side in contact with said gas-filled cavity, especially on side 2 relative to the outside (i.e. on that side of the substrate in contact with the outside of the building which is on the opposite side to the side turned toward the outside) or on side 3 (i.e. on that side of the second substrate starting from the outside of the building turned toward the outside). If the coating is a photocatalytic layer, it is preferably placed on side 1, therefore in contact with the outside of the building.

The coated substrates obtained according to the invention may also be used in photovoltaic cells or glazing or solar panels, the coating treated according to the invention being, for example, an electrode based on ZnO:Al or ZnO:Ga in multilayer stacks based on chalcopyrites (in particular of CIS type, i.e. $CuInSe_2$) or based on amorphous and/or polycrystalline silicon, or else based on CdTe.

The coated substrates obtained according to the invention may also be used in display screens of the LCD (Liquid Crystal Display), OLED (Organic Light-Emitting Diode) or FED (Field Emission Display) type, the coating treated according to the invention being, for example, an electrically conductive layer of ITO. They may also be used in electrochromic glazing, the thin layer treated according to the invention being, for example, a transparent electrically conductive layer, as taught in application FR-A-2 833 107.

The invention is illustrated with the aid of the following nonlimiting exemplary embodiments.

EXAMPLE 1

A low-emissivity multilayer stack is deposited on a 4 mm thick clear glass substrate sold under the name SGG Planilux by the applicant. The multilayer stack is deposited, in a known manner, on a sputtering line (magnetron process) in which the substrate runs beneath various targets.

Table 1 indicates the physical thickness of the layers, expressed in nm. The first line corresponds to the layer furthest from the substrate, in contact with the open air.

TABLE 1

| | |
|---|---|
| $ZnSnSbO_x$ | 2 |
| $Si_3N_4$:Al | 43 |
| ZnO:Al | 5 |
| Ti | 0.5 |
| Ag | 15 |
| ZnO:Al | 5 |
| $TiO_2$ | 11 |
| $Si_3N_4$:Al | 14 |

Table 2 below summarizes the deposition parameters used for the various layers.

TABLE 2

| Layer | Target used | Deposition pressure | Gas |
|---|---|---|---|
| $Si_3N_4$ | Si:Al at 92:8 wt % | $1.5 \times 10^{-3}$ mbar | Ar/(Ar + $N_2$) at 45% |
| $TiO_2$ | $TiO_x$ with x of the order of 1.9 | $1.5 \times 10^{-3}$ mbar | Ar/(Ar + $O_2$) at 95% |
| $ZnSnSbO_x$ | SnZn:Sb at 34:65:1 wt % | $2 \times 10^{-3}$ mbar | Ar/(Ar + $O_2$) at 58% |
| ZnO:Al | Zn:Al at 98:2 wt % | $2 \times 10^{-3}$ mbar | Ar/(Ar + $O_2$) at 52% |
| Ti | Ti | $2 \times 10^{-3}$ mbar | Ar |
| Ag | Ag | $2 \times 10^{-3}$ mbar | Ar at 100% |

The samples are treated using an in-line laser emitting radiation with a wavelength of 980 nm, past which the coated substrate runs translationally. The linear power is 40 W/mm and the thickness of the beam is 63 micrometers. The surface power density is therefore 63 kW/cm². The run speed of the substrate is 5 m/min.

The coating has, at the wavelength of the laser, a reflection of 65% and a transmission of 25%.

According to a first configuration, a mirror is placed opposite the coating that makes it possible to reflect the main radiation so as to form a secondary radiation that impacts the coating precisely at the same location as the main radiation. The loss of sheet resistance after heat treatment is then 20% to 21% in relative terms.

According to a second configuration, two mirrors and a lens are placed opposite the coating. The portion of the main radiation which is reflected by the coating is in turn reflected by the first mirror, then by a second mirror to a lens positioned so as to refocus the secondary radiation at the precise location where the main radiation impacts the coating. The loss of sheet resistance after heat treatment is then 21% to 23% in relative terms.

Without reusing the reflected portion of the main radiation, the loss of sheet resistance is 18%.

The best effectiveness of the treatment associated with this gain in loss of sheet resistance makes it possible to increase the treatment rate by around 30% at equal loss.

EXAMPLE 2

A low-emissivity multilayer stack is deposited on a 4 mm thick clear glass substrate sold under the name SGG Planilux by the applicant. The multilayer stack is deposited, in a known manner, on a sputtering line (magnetron process) in which the substrate runs beneath various targets.

Table 3 below indicates the physical thickness of the layers of the multilayer stack, expressed in nm. The first line corresponds to the layer furthest from the substrate, in contact with the open air.

TABLE 3

| | |
|---|---|
| $ZnSnSbO_x$ | 3 |
| $Si_3N_4$:Al | 45 |
| ZnO:Al | 4 |
| TiOx | 2 |
| Ag | 6.7 |
| ZnO:Al | 5 |
| $TiO_2$ | 12 |
| $Si_3N_4$:Al | 23 |

The deposition parameters used for the various layers are those from Table 2.

The samples are treated using an in-line laser emitting radiation with a wavelength of 980 nm, past which the coated substrate runs translationally. The linear power is 40 W/mm and the thickness of the beam is 63 micrometers. The surface power is therefore 63 kW/cm². The run speed of the substrate is 7.5 m/min.

The coating has, at the wavelength of the laser, a reflection of 9% and a transmission of 73%.

A mirror is placed opposite the coating that makes it possible to reflect the main radiation so as to form a secondary radiation that impacts the coating precisely at the same location as the main radiation. The loss of sheet resistance after heat treatment is then 21.3% in relative terms.

Without reusing the reflected portion of the main radiation, the loss of sheet resistance is 18%.

The best effectiveness of the treatment associated with this gain in loss of sheet resistance makes it possible to increase the treatment rate by around 30% at equal loss.

EXAMPLE 3

A layer of aluminum-doped zinc oxide, the thickness of which is 190 nm, is deposited on a 4 mm thick clear glass substrate sold under the name SGG Planilux by the applicant. The multilayer stack is deposited in a known manner, on a sputtering line (magnetron process).

The samples are treated using a $CO_2$ laser emitting, in the form of a laser line, a main radiation, the wavelength of which is 10.6 micrometers. The power of the laser is 300 W and the width of the line is of the order of 0.5 mm.

At the wavelength of the laser, the coating has a reflection of 18.5% and a transmission of 74.4%.

In a comparative test, only the main radiation is used for treating the coating. For a run speed of the substrate beneath the laser of 1.6 m/s, the gain in resistivity is 57%, the final value being $7.7 \times 10^{-4}$ Ω·cm.

In a test using the process according to the invention, an optical assembly is placed beneath the substrate that consists of two mirrors and one lens, as represented in FIG. 3, in order to reflect to the substrate the transmitted portion of the main radiation ("transmission" mode). The secondary radiation thus formed impacts the substrate precisely at the same location as the main radiation.

The use of the process according to the invention makes it possible to achieve the same gain in resistivity, but with a run speed of the substrate of 1.73 m/s, i.e. an 8% gain in productivity.

EXAMPLE 4

A 20 nm thick layer of silica then a thin layer of titanium oxide having a thickness of 10 nm and finally a thin layer of titanium having a thickness of 5 nm are deposited on a 4 mm thick clear glass substrate sold under the name SGG Planilux by the applicant. The multilayer stack is deposited, in a known manner, on a sputtering line (magnetron process) in which the substrate runs beneath various targets (in this particular case targets made of aluminum-doped silicon and of titanium).

Between the outlet of the magnetron line and the storage device, a laser-emitting device based on laser diodes emitting at a wavelength of 808 nm produces a main laser radiation focused on the titanium layer, along a line corresponding to the width of the substrate.

In a comparative test, only the main radiation is used for treating the coating. For a run speed of the substrate beneath the laser of 4 m/minute, the photocatalytic activity, measured according to the test described in application WO 2011/039488 (by monitoring the degradation of stearic acid) is $22\times10^{-4}$ cm$^{-1}\cdot$min$^{-1}$. The linear power of the laser is 37.5 W/mm.

In a test using the process according to the invention, an optical assembly consisting of a prism and a lens, as represented in FIG. 2, is placed beneath the substrate in order to reflect to the substrate the reflective portion of the main radiation ("reflection" mode). The secondary radiation thus formed impacts the substrate precisely at the same location as the main radiation.

The use of the process according to the invention makes it possible to result in the same level of photocatalytic activity, at the same laser power, but with a higher run speed of 4.2 m/min, i.e. a gain in productivity of 4%.

Conversely, for a same run speed as for the comparative test (4 m/min), the same level of photocatalytic activity was obtained, but for a lower laser power, of only 36.8 W/mm.

The invention claimed is:

1. A process for obtaining a substrate having a coating on at least one of its sides, the process comprising:
    depositing a coating on at least one side of a substrate; and
    heat treating said coating with a main laser radiation,
    wherein at least one portion of the main laser radiation transmitted through said substrate is redirected in the direction of said substrate to form at least one secondary laser radiation,
    wherein the angle formed by the secondary radiation and normal to the substrate is less than 45°,
    wherein the angles formed by the main radiation with the normal to the substrate and the at least one secondary radiation with the normal to the substrate are different, and
    wherein the secondary radiation is not polarized.

2. The process of claim 1, wherein the substrate is made of glass or of a polymeric organic material.

3. The process of claim 1, wherein the coating comprises at least one thin layer selected from the group consisting of silver layers, titanium oxide layers, and transparent electrically conductive layers.

4. The process of claim 1, wherein the temperature of the side of the substrate opposite the side treated by the at least one laser radiation does not exceed 100° C. during the heat treatment.

5. The process of claim 1, wherein the main laser radiation results from at least one laser beam forming a line which simultaneously irradiates all or some of the width of the substrate.

6. The process of claim 5, wherein a relative movement between the substrate and the or each laser line is carried out such that the difference between the respective speeds of the substrate and of the laser is greater than or equal to 4 meters per minute.

7. The process of claim 1, wherein the wavelength of the laser radiation is between 500 and 2000 nm.

8. The process of claim 1, wherein the secondary laser radiation is formed by reflecting the portion of the main laser radiation transmitted through said substrate with at least one mirror.

9. The process of claim 1, wherein the secondary laser radiation impacts the substrate at the same location as the main laser radiation.

10. The process of claim 1, wherein the secondary laser radiation has the same profile as the main laser radiation.

11. The process of claim 1, wherein the depth of focus of the secondary laser radiation is the same as that of the main laser radiation.

12. The process of claim 1, wherein the formation of the secondary laser radiation employs an optical assembly that comprises only optical elements selected from the group consisting of mirrors, prisms, and lenses.

13. The process of claim 12, wherein the optical assembly consists of two mirrors and one lens, or of one prism and one lens.

14. The process of claim 1, wherein said at least one coating is deposited by magnetron sputtering.

15. The process of claim 1, wherein the heat treating does not melt or partially melt the coating.

16. The process of claim 1, wherein the angles formed by the main radiation with the normal to the substrate and the at least one secondary radiation with the normal to the substrate are non-zero and less than 45°.

17. A process for obtaining a substrate having a coating on at least one of its sides, the process comprising:
    depositing a coating on at least one side of a substrate; and
    heat treating said coating with a main laser radiation,
    wherein at least one portion of the main laser radiation by said coating is redirected in the direction of said substrate to form at least one secondary laser radiation,
    wherein the angle formed by the secondary radiation and normal to the substrate is less than 45°,
    wherein the angles formed by the main radiation with the normal to the substrate and the at least one secondary radiation with the normal to the substrate are different,
    wherein the secondary radiation is not polarized, and
    wherein the formation of the secondary laser radiation employs an optical assembly that consists of two mirrors and one lens.

18. The process of claim 17, wherein a reflection of the coating at the wavelength of the laser is at least 20%.

19. The process of claim 17, wherein the coating comprises at least one thin layer selected from the group consisting of silver layers, titanium oxide layers, and transparent electrically conductive layers.

20. The process of claim 17, wherein the temperature of the side of the substrate opposite the side treated by the at least one laser radiation does not exceed 100° C. during the heat treatment.

21. The process of claim 17, wherein the main laser radiation results from at least one laser beam forming a line which simultaneously irradiates all or some of the width of the substrate.

22. The process of claim 17, wherein a relative movement between the substrate and the at least one laser beam forming a line is carried out such that the difference between the respective speeds of the substrate and of the laser is greater than or equal to 4 meters per minute.

23. The process of claim 17, wherein the wavelength of the laser radiation is between 500 and 2000 nm.

24. The process of claim 17, wherein the secondary laser radiation impacts the substrate at the same location as the main laser radiation.

25. The process of claim 17, wherein the angles formed by the main radiation with the normal to the substrate and the at least one secondary radiation with the normal to the substrate are non-zero and less than 45°.

* * * * *